United States Patent
Coe et al.

(10) Patent No.: US 7,196,739 B2
(45) Date of Patent: Mar. 27, 2007

(54) MULTI-CHANNEL TUNER APPARATUS

(75) Inventors: Peter Coe, Cricklade (GB); Nicholas Paul Cowley, Wroughton (GB)

(73) Assignee: Intel Corporation, Santa Clara, CA (US)

( * ) Notice: Subject to any disclaimer, the term of this patent is extended or adjusted under 35 U.S.C. 154(b) by 482 days.

(21) Appl. No.: 10/741,364

(22) Filed: Dec. 18, 2003

(65) Prior Publication Data

US 2004/0230999 A1 Nov. 18, 2004

(30) Foreign Application Priority Data

Dec. 21, 2002 (GB) .................................. 0229971.7

(51) Int. Cl.
*H04N 5/50* (2006.01)
*H04N 7/16* (2006.01)

(52) U.S. Cl. ..................... 348/731; 725/151; 725/68; 455/191.1

(58) Field of Classification Search ............... 348/731, 348/732, 726, 705, 706, 729; 375/322, 324, 375/340, 320; 725/68, 131, 139, 151; 455/179.1, 455/182.1, 183.1, 188.1, 189.1, 190.1, 255, 455/256, 302, 323, 191.1, 321

See application file for complete search history.

(56) References Cited

U.S. PATENT DOCUMENTS

| | | | | |
|---|---|---|---|---|
| 4,862,171 A | * | 8/1989 | Evans | 341/156 |
| 5,646,623 A | * | 7/1997 | Walters et al. | 342/129 |
| 5,757,848 A | * | 5/1998 | Hogberg | 375/150 |
| 5,832,043 A | * | 11/1998 | Eory | 375/344 |
| 5,966,646 A | * | 10/1999 | Lampe et al. | 455/189.1 |
| 6,134,282 A | * | 10/2000 | Ben-Efraim et al. | 375/350 |
| 6,577,855 B1 | * | 6/2003 | Moore et al. | 455/324 |
| 6,766,158 B1 | * | 7/2004 | Molnar et al. | 455/323 |
| 6,799,028 B2 | * | 9/2004 | Bauer | 455/321 |
| 6,895,063 B1 | * | 5/2005 | Cowley et al. | 375/376 |
| 6,909,754 B2 | * | 6/2005 | Breems et al. | 375/261 |

FOREIGN PATENT DOCUMENTS

GB 2372162 A 8/2002

OTHER PUBLICATIONS

Patents Act 1977: Search Report under Section 17 for United Kingdom Counterpart Application No. GB 0229971.7 (May 13, 2003)

* cited by examiner

*Primary Examiner*—Victor R. Kostak
(74) *Attorney, Agent, or Firm*—Blakely, Sokoloff, Taylor & Zafman LLP

(57) ABSTRACT

A multi-channel tuner apparatus is provided which is capable of simultaneously and independently selecting a plurality of channels for reception. The apparatus comprises a plurality of tuners, each of which converts a selected channel to a near-zero intermediate frequency. The output signals from the tuners are supplied to respective sample/hold circuits, whose outputs are supplied to a single analogue/digital converter for multiplexing the tuner signals and converting them to the digital domain. A common demodulator arrangement processes the digital domain signal to extract the information from all of the selected channels.

8 Claims, 2 Drawing Sheets

MULTI-CHANNEL TUNER APPARATUS

TECHNICAL FIELD

The present invention relates to a multi-channel tuner apparatus for simultaneously and independently selecting a plurality of channels for reception. Such an arrangement may be used, for example, for digital satellite broadcast signals, terrestrial broadcast signals and cable distribution systems.

BACKGROUND

It is known for satellite set-top box arrangements to provide multi-channel reception capability, for example for PVR (personal video recorder) type applications. For such applications, each channel must be receivable independently of each other channel selected for reception. This is particularly important in satellite applications because the signal received from an outdoor unit covers a wider frequency range than the operating range of a typical set-top box and contains two polarisations which effectively overlap. To accommodate this, it is known to have one or two cable feeds from the outdoor unit to the set-top box, each of which can potentially carry any channel from the spectrum of a received signal.

FIG. 1 of the accompanying drawings illustrates a typical multi-channel tuner arrangement for such an application. The cable feeds are shown at 1 and 2 and are connected to independent signal paths 3 and 4, respectively, although a single cable feed connected to both signal paths may also be used. The signal paths are substantially identical so that only the path 3 is shown and will be described in detail.

The signal path 3 comprises a zero intermediate frequency (ZIF) tuner 5 connected to a demodulator arrangement 6. The tuner 5 comprises a quadrature mixer 7, which receives a broadband input signal from the cable feed 1 directly or via other stages (not shown), such as a low noise amplifier and an automatic gain control arrangement. The mixer 7 receives quadrature signals from a local oscillator (LO) 8 controlled by a phase locked loop (PLL) synthesiser 9. The PLL 9 receives a reference frequency signal from a reference oscillator 10, which is common to both of the tuners, although independent reference oscillators could alternatively be provided.

Tuner operation is controlled by a common controller 11, which could also be replaced by separate controllers for the individual tuners. The synthesiser 9 is controlled in accordance with a request from a user for reception of a selected channel. The synthesiser 9 controls the oscillator 8 to provide quadrature signals whose frequency is substantially equal to the centre frequency of the channel selected for reception. The mixer 7 converts the selected channel to in-phase I and quadrature Q baseband signals centred around 0 Hz.

The signals I and Q are supplied to respective low pass filters (LPF) 12 and 13, which filter the baseband signals so as to attenuate or remove signal energy from non-selected channels. The filters 12 and 13 may be connected directly to the mixer 7 or via other stages (not shown), such as amplifiers and automatic gain control arrangements. Similarly, the output signals of the filters 12 and 13 may be supplied directly to the tuner outputs or may be supplied via other stages (not shown), such as amplifiers and automatic gain control arrangements.

The filtered I and Q signals from the tuner 5 are supplied to respective analogue/digital converters (ADC) 14 and 15, which sample the quadrature components and convert them to respective independent data streams. The data streams are supplied to a demodulator block 16, which typically filters, fine tunes, and demodulates the received quadrature signal. The demodulated signals are then supplied to a forward error correction (FEC) block 17, which performs the appropriate error correction in accordance with the modulation standard of the received channel. The block 17 supplies the output signal at an output 18 of the tuner arrangement.

The broadband signals supplied via the cable feed 2 are likewise processed by the second ZIF tuner 19 and the second demodulator arrangement 20 and the resulting signals appear at a second tuner arrangement output 21 as a separate transport stream. Each of the transport streams may be parallel or analogue or the streams may be multiplexed together. Although only two signal paths 3 and 4 are shown, any number of such paths may be provided according to application requirements.

Although such an arrangement functions satisfactorily, it is relatively complex and expensive. In particular, most or all of the individual functions have to be duplicated or multiplicated.

SUMMARY

According to the invention, there is provided a multi-channel tuner apparatus for simultaneously and independently selecting a plurality of channels for reception, comprising: a plurality of tuners, each of which is arranged to convert a selected channel to a near-zero intermediate frequency; a respective sample/hold circuit for sampling the near-zero intermediate frequency output signal of each channel; a single analogue/digital converter for converting the output signals of all of the sample/hold signals to a single digital signal; and a demodulator arrangement for processing the digital signal to extract the information from all of the selected channels.

The plurality of tuners may comprise two tuners.

Each of the tuners may comprise an image reject mixer.

The converter may be arranged to receive samples from the sample/hold circuits in turn.

Each of the tuners may comprise a single intermediate frequency filter. Each of the intermediate frequency filters may comprise a low pass filter.

Each of the tuners may comprise a local oscillator which is tuneable to a frequency above and adjacent the centre frequency of the selected channel.

The tuners may be substantially identical to each other.

The demodulator arrangement may be arranged to perform quadrature signal extraction.

It is thus possible to provide an apparatus which is of reduced complexity and reduced cost of manufacture compared with known arrangements. For example, when embodied as one or more integrated circuits, less area is required so that a more cost-effective arrangement can be provided.

BRIEF DESCRIPTION OF THE DRAWINGS

Like reference numerals refer to like parts throughout the drawings.

DETAILED DESCRIPTION

Figure 1:
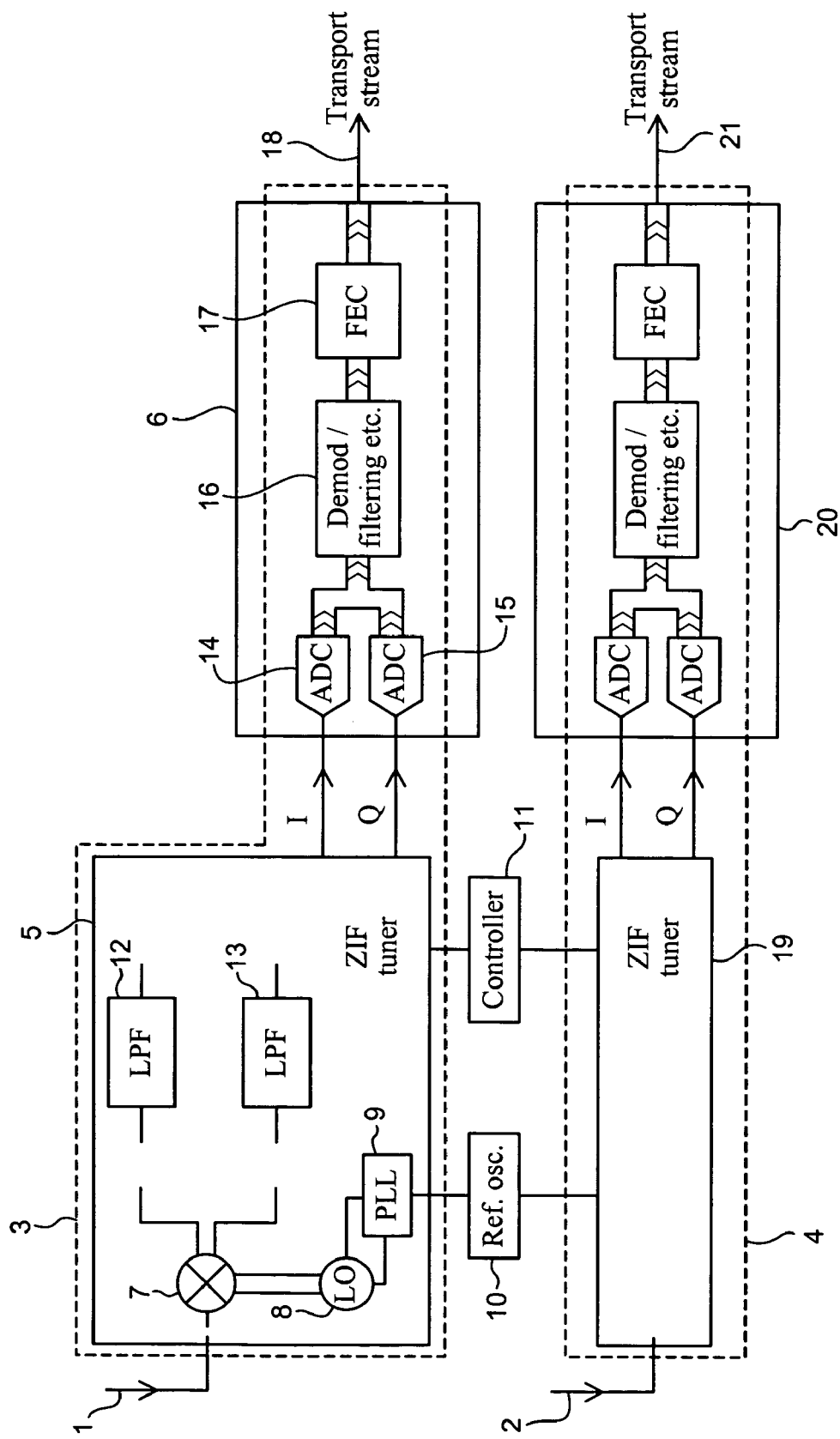
FIG. 1 is a block schematic diagram of a known multi-channel tuner arrangement.
Figure 2:
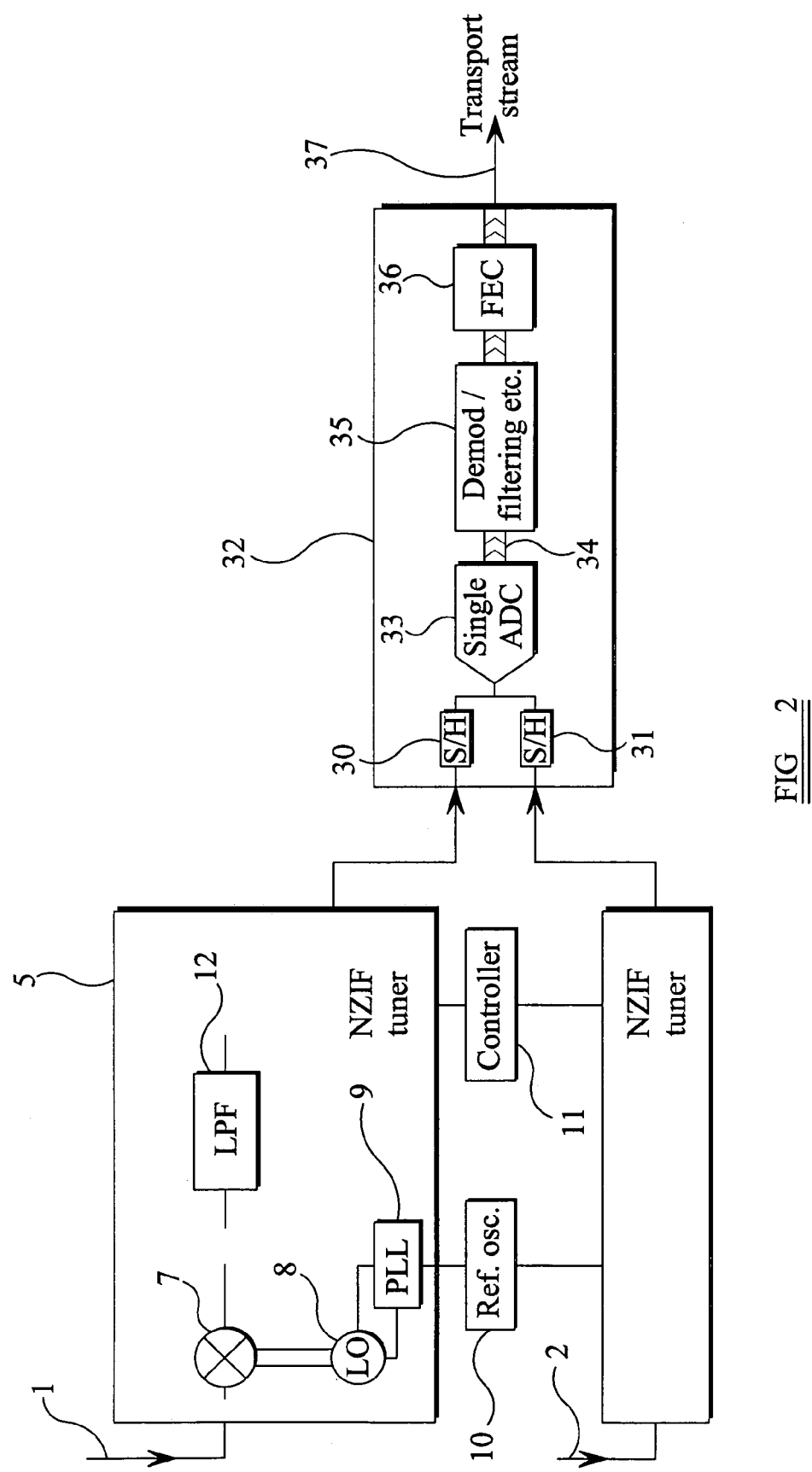
FIG. 2 is a block schematic diagram of a multi-channel tuner apparatus constituting an embodiment of the invention.

The multi-channel tuner apparatus shown in FIG. 2 comprises a two channel arrangement, but more than two channels may be provided in accordance with the specific application. The apparatus comprises a common reference oscillator 10 and a common controller 11 of the same type as shown in FIG. 1 although, again, separate reference oscillators and controllers could be provided for each tuner 5.

The tuner 5 shown in FIG. 2 differs from that shown in FIG. 1 in that it is a near-zero intermediate frequency (NZIF) tuner. Further, the mixer 7 is an image reject mixer. The controller 11 controls the synthesiser 9 in accordance with selection by a user of a desired channel for reception from the broadband signal supplied via the cable feed 1. The synthesiser 9 controls the local oscillator 8 such that its frequency is adjacent but slightly above the centre frequency of the selected channel. The mixer 7 thus converts the selected channel to an NZIF signal supplied at the single output of the mixer 7. Thus, the frequency content of the NZIF signal is maintained and this allows for quadrature component extraction at a later stage of the apparatus.

Whereas the ZIF mixer 7 in FIG. 1 separates the I and Q signals which thus require separate filtering, the mixer 7 of FIG. 2 provides a single output signal. Thus, only a single low pass filter 12 is required in the tuner 5.

The output signals from the tuners 5 and 19 are supplied to sample/hold circuits 30 and 31, respectively, in a single demodulator arrangement 32. The samples supplied by the circuits 30 and 31 are alternately converted to the digital domain by a single analogue/digital converter (ADC) 33 so that the channels selected by the tuners 5 and 19 are multiplexed to a single data stream at the output 34 of the ADC 33. The resulting multiplexed digital signal is then processed by a demodulator block 35 and a forward error correction (FEC) block 36, before being supplied to the output 37 of the apparatus as a transport stream containing the demodulated and error-corrected information in digital form from the two selected channels. The block 35 performs the quadrature component extraction in addition to the filtering and demodulation required by the modulation standard. The multiplexed channel signals are processed by common blocks 35 and 36 in accordance with known techniques which have little penalty in terms of complexity and cost of manufacture.

The apparatus shown in FIG. 2 is thus less complex and requires less integrated circuit space than the known arrangement shown in FIG. 1. For example, the four ADCs in FIG. 1 are replaced by a single ADC and a dual sample/hold arrangement. Also, the four intermediate frequency filters of FIG. 1 are replaced by two intermediate frequency filters. Further, the pairs of demodulation and error correction blocks of FIG. 1 are replaced by single blocks. The apparatus of FIG. 2 therefore has substantial design, manufacture and cost advantages compared with the arrangement of FIG. 1 while providing satisfactory performance.

What is claimed is:

1. A multi-channel tuner apparatus for simultaneously and independently selecting a plurality of channels for reception, said apparatus comprising:
   a plurality of tuners, each of which having a single intermediate frequency filter, and arranged to convert a selected channel to a near-zero intermediate frequency;
   a plurality of sample/hold circuits, each of which is arranged to sample said near-zero intermediate frequency output signal of a respective one of said tuners;
   a single analog/digital converter for converting output signals of all of said sample/hold circuits to a single digital signal; and
   a demodulator arrangement for processing said signal digital signal to extract information from all of said selected channels.

2. An apparatus as claimed in claim 1, in which said plurality of tuners comprises two tuners.

3. An apparatus as claimed in claim 1, in which each of said tuners comprises an image reject mixer.

4. An apparatus as claimed in claim 1, in which said analog/digital converter is arranged to receive samples from said sample/hold circuits in turn.

5. An apparatus as claimed in claim 1, in which each of said intermediate frequency filter comprises a low pass filter.

6. An apparatus as claimed in claim 1, in which each of said tuners comprises a local oscillator which is tuneable to a frequency above and adjacent a centre frequency of said selected channel.

7. An apparatus as claimed in claim 1, in which said tuners are substantially identical to each other.

8. An apparatus as claimed in claim 1, in which said demodulator arrangement is arranged to perform quadrature signal extraction.

* * * * *